United States Patent [19]

Millington et al.

[11] 3,848,143

[45] Nov. 12, 1974

[54] SELF-COMPENSATED AMPLIFIER CIRCUIT

[75] Inventors: Raymond J. Millington; John R. Rexek, both of Coral Springs, Fla.

[73] Assignee: Motorola, Inc., Franklin Park, Ill.

[22] Filed: Mar. 12, 1973

[21] Appl. No.: 340,851

Related U.S. Application Data

[63] Continuation of Ser. No. 198,594, Nov. 15, 1971, abandoned.

[52] U.S. Cl. .................................. 307/297, 330/40

[51] Int. Cl. ........................................... H03k 1/14

[58] Field of Search...... 330/22 CP, 38 M; 307/229, 307/297; 328/35

[56] References Cited

UNITED STATES PATENTS

| | | | |
|---|---|---|---|
| 2,822,434 | 2/1958 | Ehret | 330/22 X |
| 3,440,351 | 4/1969 | Boll | 330/22 X |
| 3,538,449 | 11/1970 | Solomon | 330/30 |
| 3,659,121 | 4/1972 | Frederiksen | 330/22 X |
| 3,699,467 | 10/1972 | Grout | 330/22 X |

*Primary Examiner*—Herman Karl Saalbach
*Assistant Examiner*—James B. Mullins
*Attorney, Agent, or Firm*—Eugene A. Parsons; Vincent J. Rauner

[57] ABSTRACT

A self-compensated semiconductor amplifier operable over the voltage range of a one cell battery and having an output voltage which varies inversely with the voltage applied by the one cell battery. The amplifier has a first transistor including base, emitter and collector electrodes. First and second resistors are serially connected from the collector electrode to the one cell battery. The base electrode is coupled to the junction of the first and second series connected resistors to provide a bias voltage at the base electrode, and for maintaining a constant voltage at the junction of the two resistors. The emitter electrode is coupled to ground potential. An output circuit is coupled to the collector electrode, and the collector electrode develops an output voltage thereat which is less than the bias voltage at the base electrode, and which varies inversely with the one cell battery voltage.

9 Claims, 2 Drawing Figures

SELF-COMPENSATED AMPLIFIER CIRCUIT

This is a continuation of application Ser. No. 198,594, filed Nov. 15, 1971 and now abandoned.

BACKGROUND

Amplifiers and particularly semiconductor amplifiers are usually designed to provide a stable voltage at the collector of the semiconductor over the operating voltage range of the supply source. In certain multi-stage amplifier circuits, and particularly amplifier circuits designed to operate from a one cell battery such as described in co-pending patent application, Ser. No. 151,460 (Case Number CM-70109) filed June 9, 1971, and assigned to the same assignee, amplification characteristics and timing characteristics of certain stages cannot be maintained at a constant level over the operating voltage range. As it is desirable to maintain the overall operation and amplification characteristics constant over the operating voltage range, certain stages must be designed as compensating stages allowing a variation in their operating characteristics in accordance with variations in operating voltage. As the stages in the above noted amplifiers are direct current coupled, it is particularly desirable that the collector voltages of particular stages vary in accordance with the variations in operating voltage levels. This must be accomplished while using a minimum number of components so as to facilitate incorporation of the circuitry into miniature radio products.

SUMMARY

It is an object of this invention to provide a self-compensated semiconductor amplifier circuit which is operable over the voltage range of a one cell battery.

Another object of this invention is to provide a self-compensated semiconductor amplifier circuit having operating characteristics which vary in accordance with the operating voltage level.

Yet another object of this invention is to provide a self-compensated semiconductor amplifier circuit requiring a minimum number of components.

In practicing this invention, a semiconductor amplifier is provided which is operable over the voltage range of a one cell battery, and has an output voltage which varies inversely with the voltage applied by the one cell battery. The amplifier includes a transistor having base, emitter and collector electrodes. The emitter electrode is coupled to a ground or reference potential, and two serially connected resistors are coupled from the collector electrode to the supply voltage. The base electrode is coupled to the junction of the two serially connected resistors for providing a bias voltage at the base electrode, and for maintaining a constant voltage at the junction. Maintaining a constant voltage at the junction causes the output voltage developed at the collector electrode to vary inversely with the voltage level of the one cell battery, and to be maintained at a voltage less than the bias voltage at the base electrode. This amplifier can be used to compensate a timing circuit, to compensate a multi-stage amplifier, and to compensate for supply voltage variations in other applications.

DETAILED DESCRIPTION

Figure 1:
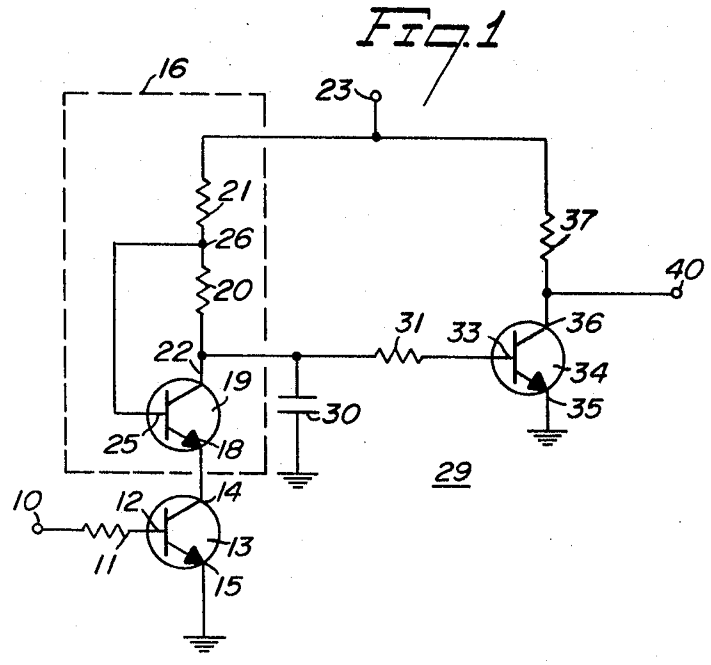
FIG. 1 is a schematic diagram of one embodiment of the self-compensated semiconductor amplifier circuit of this invention shown coupled to a timing circuit.

Referring to FIG. 1, in this circuit, a trigger pulse is supplied to start a timed interval. The trigger pulse input signal is coupled to terminal 10. Resistor 11 couples terminal 10 to base electrode 12 of switching transistor 13. Emitter electrode 15 of transistor 13 is coupled to ground potential, and the collector electrode 14 is coupled to the emitter electrode 18 of transistor 19 in self-compensated amplifier 16. Two serially connected resistors 20 and 21 in amplifier 16 couple collector electrode 22 of transistor 19 to a source of supply voltage at terminal 23. In the embodiments shown, resistor 21 is selected to have a resistance approximately twice the resistance of resistor 20, and the source of supply voltage is a one cell battery. A one cell battery has a nominal voltage of 1.2 volts and an operating voltage range of 0.9 to 1.6 volts. Base electrode 25 of transistor 19 is coupled to the junction 26 between serially connected resistors 20 and 21 in amplifier 16. A timing capacitor 30 is coupled from collector electrode 22 of transistor 19 to ground potential. Resistor 31 couples the signals developed across timing capacitor 30 to base electrode 33 of transistor 34 in timing amplifier 29. Emitter electrode 35 of transistor 34 is coupled to ground potential, and collector electrode 36 is coupled through resistor 37 to the supply voltage at terminal 23. Signals developed at collector electrode 36 of transistor 34 are coupled to output terminal 40.

Transistor 13 with no signal coupled to base 12, is in a nonconductive state. When transistor 13 is nonconductive, transistor 19 is also nonconductive. When transistor 13 and 19 are switched from a conductive to a nonconductive state, the voltage developed at collector 22 of transistor 19 causes capacitor 30 to begin charging towards supply potential. The voltage developed across capacitor 30 is coupled through resistor 31 to base 33 of transistor 34. When this voltage reaches a predetermined level, it will render transistor 34 conductive. In the embodiment shown, transistor 34 will be rendered conductive in response to a voltage at base electrode 33 of approximately 0.65 volts. This turn on point is constant, and is determined by the $V_{BE}$ of transistor 34. With transistor 34 conductive, collector 36 and therefore output terminal 40 approach ground potential to provide the desired output timing signal.

When the desired input signal is coupled to input terminal 10, and through resistor 11 to base electrode 12 of transistor 13, it will render transistor 13 fully conductive. With transistor 13 fully conductive, collector electrode 14, and therefore emitter electrode 18 of transistor 19 in self-compensated amplifier 16 will approach ground potential. With emitter electrode 18 of transistor 19 at approximately ground potential, transistor 19 is rendered fully conductive, allowing current to flow through the series combination of transistors 13 and 19. The direct connection from base electrode 25 of transistor 19 to junction 26 causes the voltage at junction 26 to be maintained at a constant level in the presence of supply voltage variations. This constant voltage is approximately equal to the base to emitter voltage drop of transistor 19 ($V_{BE}$), plus the saturation voltage of transistor 13 ($V_{sat}$) above ground. With a constant voltage maintained at junction 26, and an increased current flowing through resistors 20 and 21 and transistors 13 and 19, the voltage at collector 22 will be substantially reduced and will be maintained at a voltage less than the voltage at base electrode 25. This reduced voltage will cause capacitor 30 to discharge through the path provided by transistors 19 and 13. Capacitor 30 will discharge to a voltage level which is below that level necessary to render transistor 34 conductive, thus causing transistor 34 to be rendered nonconductive.

The voltage to which capacitor 30 will discharge is determined by the voltage at collector electrode 22 of transistor 19 when transistors 13 and 19 are conductive. When the input signal coupled to input terminal 10 is removed, transistors 13 and 19 will again be rendered nonconductive, increasing the voltage at collector electrode 22 of transistor 19, and causing capacitor 30 to begin a new charging cycle.

In the embodiment shown in FIG. 1, if the voltage level to which capacitor 30 discharges is maintained constant, the timing period necessary to charge capacitor 30, and to cause conduction of transistor 34, will vary in accordance with variations in the supply voltage. This is due to the variations in charge current rate through resistors 20 and 21 with variations in supply voltage. It is desirable for a proper operation of this circuit that transistor 34 be rendered conductive, a predetermined constant period of time after the desired input signal is coupled to input terminal 10. This timing period must be maintained as a constant over the entire operating voltage range of a one cell battery.

To maintain a constant time period over the operating voltage range of a one cell battery, the circuit described is used with the base electrode 25 of transistor 19 coupled to junction 26 of resistors 20 and 21. As previously stated, this causes junction 26 to be maintained at a constant voltage when transistors 13 and 19 are conductive. Junction 26 is maintained at a constant voltage over the entire operating voltage range of the one cell battery because the base to emitter voltage drop of transistor 19 remains constant over the operating voltage range. The variations in operating voltage supplied by the one cell battery at terminal 23 will result in a variation in current flow through resistors 20 and 21 and through transistors 19 and 13 when these transistors are conductive. This will result in a variation in voltage developed at collector electrode 22 of transistor 19. The variation in voltage developed at collector electrode 22 will be inversely proportional to the variation in voltage of the one cell battery coupled to terminal 23. That is, with an increased supply voltage at terminal 23, for example 1.6 volts, an increased current will flow through resistors 21 and 22, causing a decrease in the voltage developed at collector electrode 22 of transistor 19. The decreased voltage at collector 22 will cause capacitor 30 to discharge to a lower voltage level. The charge time necessary to allow capacitor 30 to charge from the newly established lower voltage level to that point necessary to cause operation of transistor 34, will however, remain equal to that time period necessary to initiate operation of transistor 34 when using a one cell battery having a potential of 1.2 volts, because of the increased charge current rate.

When the supply potential decreases, as for example when a one cell battery having a voltage of 0.9 volts is used, the current flowing through resistors 20 and 21 will decrease, causing a higher voltage to be developed at collector electrode 22 of transistor 19. Capacitor 30 will discharge to a new higher voltage level when transistors 13 and 19 are conductive. The charge time necessary to allow capacitor 30 to charge from the new higher voltage level to that point necessary to cause operation of transistor 34 will again remain constant because of the decreased charge current rate.

Figure 2:
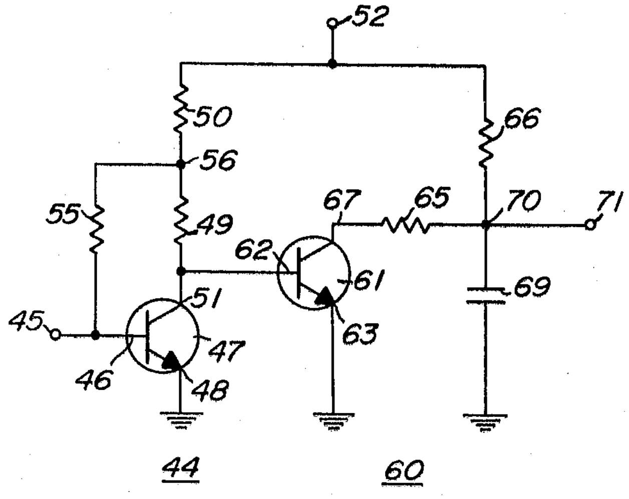
FIG. 2 is a second embodiment of the self-compensated semiconductor amplifier circuit of this invention shown coupled to an amplifier stage.

Referring to FIG. 2, the self-compensated semiconductor amplifier is here shown incorporated as a part of an A.C. amplifying circuit which is an integral part of an A.C. level detector circuit rather than a timing circuit. Input signals are coupled from terminal 45 to base electrode 46 of transistor 47 in self-compensated semiconductor amplifier 44. Emitter electrode 48 of transistor 47 is coupled to ground potential, and serially connected resistors 49 and 50 couple collector electrode 51 of transistor 47 to the source of supply voltage at terminal 52. Base electrode 46 of transistor 47 is also coupled through resistor 55 to junction 56 between resistors 49 and 50. In the embodiment shown, resistor 50 is 10,000 ohms, resistor 49 is 4,700 ohms, resistor 55 is 12,000 ohms and the source of supply voltage is a one cell battery.

A second amplifier stage 60 is coupled to the output of amplifier 44. Transistor 61 in amplifier 60 has its base electrode 62 coupled to collector electrode 51 of transistor 47. Emitter electrode 63 of transistor 61 is coupled to ground potential, and serially connected resistors 65 and 66 couple collector electrode 67 of transistor 61 to supply terminal 52. Capacitor 69 is coupled between ground potential and the junction 70 of resistors 65 and 66, and is also coupled to output terminal 71. Resistor 65 and capacitor 69 act to integrate the signal developed by transistor 61.

The two stages serve as an A.C. level detector which operates as follows. A D.C. shift in output voltage at terminal 71 will occur when the instantaneous sum of the A.C. and D.C. voltages at base electrode 62 equals the turn-on voltage ($V_{BE}$) of transistor 61. The sum of A.C. and D.C. voltages below this threshold will produce no change in output.

In this embodiment, an A.C. signal coupled to input terminal 45 of amplifier 44 will be amplified by transistor 47 in accordance with its A.C. gain characteristic. With variations in voltage level of the operating voltage supplied at terminal 52, the gain of transistor 47, will vary. This gain variation will cause variations in the amplification of the signal coupled to amplifier 44 in accordance with variations in operating voltage level. The variations in the amplified signal developed at collector 51 of transistor 47 will cause a variation in the point at which transistor 61 is rendered conductive in response to the A.C. signal. That is, an increased gain, in response to an increased supply voltage, will cause transistor 61 to be rendered conductive at a lower A.C. input voltage at terminal 45, and a decreased gain, in response to a lower supply voltage, will cause transistor 61 to be rendered conductive at a higher A.C. input voltage at terminal 45. As with the embodiment shown in FIG. 1 it is important that the operating characteristics of the amplifiers remain constant over the entire operating voltage range of a one cell battery. To compensate for this variation in gain characteristics of transistor 47, and cause transistor 61 to be rendered conductive at the same A.C. input voltage level coupled to terminal 45, resistor 55 is coupled from base 46 of transistor 47 to junction 56 between resistors 50 and 49. Resistor 55 acts to provide a bias voltage at base 46 of transistor 47 and also causes the voltage developed at junction 56 to be maintained at a constant level over the entire operating voltage range of a one cell battery. Resistor 55 is selected such that a very small voltage drop is developed thereacross. The voltage developed at junction 56 is therefore equal to approximately the base-emitter voltage drop, $V_{BE}$ of transistor 47. Because the voltage at junction 56 is maintained substantially constant, the DC voltage at collector 51 of transistor 47 will vary in accordance with variations in supply voltage in the same manner as that described above with reference to FIG. 1. As the DC bias voltage for transistor 61 is coupled to base 62 of transistor 61 from collector 51 of transistor 47, the DC bias voltage for transistor 61 will vary inversely with the supply voltage of the one cell battery. For example, should the supply voltage increase to 1.6 volts, the gain of transistor 47 will increase. This increased gain will cause a resultant increase in the AC signal coupled to base 62 of transistor 61. At the same time, however, the DC voltage at collector 51 of transistor 47 will decrease so that the DC bias voltage at base 62 is decreased. The combination of lower DC operating point and greater amplification of the AC signal, cause transistor 61 to be rendered conductive at the same AC voltage level at input terminal 45 as was required for the nominal of 1.2 volt operating supply potential.

Decreases in operating supply potential such as occur when a 0.9 volt one cell battery is used, cause a decrease in the amplification characteristics of transistor 47. This decrease in amplification characteristics would require an increase in AC voltage level at input terminal 45 to produce conduction of transistor 62. The decrease in supply potential however, results in an increase in the DC voltage developed at collector 51 of transistor 47 so that the change in amplification characteristics is compensated, allowing the turn on point of transistor 61 to remain constant, and consistent with the threshold condition provided when a one cell battery having a nominal voltage of 1.2 volts is coupled to terminal 52.

As can be seen, a self-compensated semiconductor amplifier has been provided which is operable over the voltage range of a one cell battery. The circuit interconnections of this amplifier are such as to provide an output voltage at the collector which varies inversely with the variations in operating voltage supplied by a one cell battery, while requiring a minimum number of components.

We claim:

1. A semiconductor amplifier operable over the voltage range of a one cell battery and having a DC output voltage which varies inversely with the voltage applied by the one cell battery, said amplifier including in combination, a first transistor having base, emitter and collector electrodes, means coupling said emitter electrode to a reference potential, first resistance means having a first terminal coupled to said collector electrode and a second terminal, second resistance means having a first terminal coupled to said first resistance means second terminal and forming a first junction thereat, and a second terminal adapted to be coupled to the one cell battery, means coupling said base electrode to said first junction for providing a bias voltage at said base electrode substantially the same as the voltage at said first junction, and for maintaining a constant voltage at said first junction over the voltage range of the one cell battery, output circuit means coupled to said collector electrode, said collector electrode developing said output voltage thereat, said output voltage being less than the bias voltage at said base electrode and varying inversely with the voltage of the one cell battery.

2. The semiconductor amplifier of claim 1 wherein said first resistance means is a resistor and said second resistance means is a resistor, said second resistance means having a resistance substantially twice that of said first resistance means.

3. The semiconductor amplifier of claim 2 wherein said means coupling said base electrode to said first junction is a resistor, said resistor having a voltage thereacross, said voltage having a value small as compared to the voltage of the one cell battery.

4. The semiconductor amplifier of claim 2 wherein said means coupling said base electrode to said first junction is a wire conductor.

5. The semiconductor amplifier of claim 3 further including input means coupled to said base electrode of said first transistor for coupling an input signal thereto, said output circuit means including second transistor means having base, emitter and collector electrodes, said base electrode being coupled to said collector electrode of said first transistor for receiving said output voltage therefrom, said emitter electrode being coupled to said reference potential, and said collector electrode of said second transistor being coupled to the one cell battery.

6. The semiconductor amplifier of claim 4 further including second transistor means having base, emitter and collector electrodes, said emitter electrode being coupled to ground potential and said collector electrode being coupled to said emitter electrode of said first transistor, input means coupled to said base electrode of said second transistor for coupling an input signal thereto, said output circuit means including capacitor means coupled to said first transistor collector electrode and to ground potential, third transistor means having base emitter and collector electrodes, said emitter electrode being coupled to ground potential, means coupling said collector electrode of said first transistor to said base electrode of said third transistor, and means coupling said collector electrode of said third transistor to said one cell battery.

7. A semiconductor amplifier including in combination, a first transistor having base, emitter and collector electrodes, means coupling said emitter electrode to a reference potential for providing a constant potential at said emitter, first resistance means having a first terminal coupled to said collector electrode and a second terminal, second resistance means having a first terminal connected to said first resistance means second terminal and forming a first junction thereat and a second terminal coupled to a source of supply potential, means coupling said base electrode to said first junction for providing a bias voltage at said base electrode substantially the same as the voltage at said first junction and for maintaining a constant voltage at said first junction over a predetermined range of said source of supply potential, output circuit means coupled to said collector electrode, said collector electrode developing an output voltage thereat, said output voltage being less than the bias voltage at said base electrode and varying inversely with the voltage of the source of supply potential.

8. The semiconductor amplifier including in combination, a first transistor having base, emitter and collector electrodes, means coupling said emitter electrode to a reference potential for providing a constant potential at said emitter, first resistance means having a first terminal coupled to said collector electrode and a second terminal, second resistance means having a first terminal connected to said first resistance means second terminal and forming a first junction thereat and a second terminal coupled to a source of supply potential, means coupling said base electrode to said first junction for providing a bias voltage at said base electrode substantially the same as the voltage at said first junction and for maintaining a constant voltage at said first junction, said collector electrode developing a voltage thereat less than the bias voltage at said base electrode.

9. A semiconductor amplifier including in combination, a first transistor having base, emitter and collector electrodes, means coupling said emitter electrode to a reference potential, first resistance means having a first terminal coupled to said collector electrode and a second terminal, second resistance means having a first terminal directly connected to said first resistance means second terminal and forming a first junction thereat and a second terminal coupled to a source of supply potential, said base electrode being directly connected to said first junction with substantially no resistance therebetween, and output circuit means coupled to said collector electrode.

* * * * *